United States Patent
Adkisson et al.

(10) Patent No.: US 7,886,240 B2
(45) Date of Patent: Feb. 8, 2011

(54) MODIFYING LAYOUT OF IC BASED ON FUNCTION OF INTERCONNECT AND RELATED CIRCUIT AND DESIGN STRUCTURE

(75) Inventors: James W. Adkisson, Jericho, VT (US); Natalie B. Feilchenfeld, Jericho, VT (US); Jeffrey P. Gambino, Westford, VT (US); Howard S. Landis, Underhill, VT (US); Benjamin T. Voegeli, Burlington, VT (US); Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 481 days.

(21) Appl. No.: 12/021,333

(22) Filed: Jan. 29, 2008

(65) Prior Publication Data
US 2009/0193378 A1 Jul. 30, 2009

(51) Int. Cl.
G06F 17/50 (2006.01)
G06F 7/38 (2006.01)
H01L 25/00 (2006.01)
H03K 19/00 (2006.01)

(52) U.S. Cl. ............ 716/4; 716/9; 716/10; 716/13; 716/14; 326/37; 326/47; 326/101

(58) Field of Classification Search .......... 716/4, 716/9, 10, 13, 14; 326/37, 47, 101
See application file for complete search history.

(56) References Cited

U.S. PATENT DOCUMENTS

| | | | |
|---|---|---|---|
| 5,247,455 A | 9/1993 | Yoshikawa | |
| 6,327,695 B1 * | 12/2001 | Bothra et al. | 716/8 |
| 6,507,216 B1 | 1/2003 | Lane et al. | |
| 6,510,544 B1 | 1/2003 | Matsumoto et al. | |
| 6,662,348 B1 | 12/2003 | Naylor et al. | |
| 6,948,143 B2 | 9/2005 | Donelly et al. | |
| 7,590,962 B2 * | 9/2009 | Frenkil et al. | 716/11 |
| 7,714,407 B2 * | 5/2010 | Udrea et al. | 257/501 |
| 2001/0019166 A1 * | 9/2001 | Tsuyuki | 257/500 |

(Continued)

FOREIGN PATENT DOCUMENTS

EP 0431532 A2 6/1991

OTHER PUBLICATIONS

Cho et al., "Wire Density Driven Global Routing for CMP Variation and Timing", IEEE/ACM International Conference on Computer-Aided Design, Nov. 5-9, 2006, pp. 487-492.*
Chen et al., "Novel Wire Density Driven Full-Chip Routing for CMP Variation Control", Nov. 4-8, 2007, pp. 831-838.*

*Primary Examiner*—Phallaka Kik
(74) *Attorney, Agent, or Firm*—Anthony J. Canale; Hoffman Warnick LLC

(57) ABSTRACT

Modifying a layout of an integrated circuit (IC) based on a function of an interconnect therein and a related circuit and design structure are disclosed. In one embodiment, a method includes identifying a function of an interconnect in the layout from data of the layout embodied in a computer readable medium; and modifying the layout to form another layout that accommodates the function of the interconnect. A design structure embodied in a machine readable medium used in a design process, according to one embodiment, may include a circuit including a high voltage interconnect positioned in a dielectric layer, the high voltage interconnect positioned such that no fill is above or below the high voltage interconnect.

17 Claims, 4 Drawing Sheets

U.S. PATENT DOCUMENTS

| | | | |
|---|---|---|---|
| 2003/0208721 A1* | 11/2003 | Regnier | 716/1 |
| 2004/0056280 A1 | 3/2004 | Murata et al. | |
| 2004/0139412 A1* | 7/2004 | Ito et al. | 716/8 |
| 2005/0262463 A1* | 11/2005 | Cohn et al. | 716/10 |
| 2007/0192755 A1* | 8/2007 | Regnier | 716/5 |
| 2009/0300569 A1* | 12/2009 | Frenkil et al. | 716/10 |

* cited by examiner

MODIFYING LAYOUT OF IC BASED ON FUNCTION OF INTERCONNECT AND RELATED CIRCUIT AND DESIGN STRUCTURE

BACKGROUND

1. Technical Field

The disclosure relates generally to integrated circuit (IC) chip fabrication and design, and more particularly, to modifying a layout of an IC based on a function of an interconnect, and a related circuit and design structure.

2. Background Art

In the integrated circuit (IC) chip industry, layouts of an IC and related groundrules are typically arranged to accommodate minimum metal line density, high speed performance, minimize capacitance such that voltages can scale downwardly (e.g., <5 V). New technology, however, may use structures that have functions that are not accommodated by current groundrules. For example, high voltage applications (e.g., >30 V) present a number of issues such as shorting issues not envisioned by current groundrules. Where copper (Cu) wiring is used this situation becomes more complicated. For example, fill shapes used with copper wiring need to be modified to accommodate the high voltage applications. In particular, breakdown fields in back end of line (BEOL) materials may be between 3 and 5 MV/cm depending on the material used (e.g., low dielectric constant material (low-k) or oxides). This breakdown range requires larger spacing between interconnects and/or fill shapes to accommodate the higher voltages. Thus, the breakdown range may require new groundrules and/or new restrictions on fill shapes and interconnect spacing. Other structures having specialized functions may also not be accommodated by current groundrules.

SUMMARY

Modifying a layout of an integrated circuit (IC) based on a function of an interconnect therein, and a related circuit and design structure are disclosed. In one embodiment, a method includes identifying a function of an interconnect in the layout from data of the layout embodied in a computer readable medium; and modifying the layout to form another layout that accommodates the function of the interconnect. A design structure embodied in a machine readable medium used in a design process, according to one embodiment, may include a circuit including a high voltage interconnect positioned in a dielectric layer, the high voltage interconnect positioned such that no fill is above or below the high voltage interconnect.

A first aspect of the disclosure provides a method of modifying a layout of an integrated circuit (IC), the method comprising: identifying a function of an interconnect in the layout from data of the layout embodied in a computer readable medium; and modifying the layout to form another layout that accommodates the function of the interconnect.

A second aspect of the disclosure provides a system for modifying a layout of an integrated circuit (IC), the system comprising: means for identifying a function of an interconnect in the layout from data of the layout embodied in a computer readable medium; and means for modifying the layout to form another layout that accommodates the function of the interconnect.

A third aspect of the disclosure provides an integrated circuit comprising: a high voltage interconnect positioned in a dielectric layer, the high voltage interconnect positioned such that no fill is above or below the high voltage interconnect.

A fourth aspect of the disclosure provides a design structure embodied in a machine readable medium used in a design process, the design structure comprising: a circuit including a high voltage interconnect positioned in a dielectric layer, the high voltage interconnect positioned such that no fill is above or below the high voltage interconnect at one level above the interconnect and one level below the interconnect.

A fifth aspect of the disclosure provides a program product stored on a computer-readable medium, which when executed, modifies a layout of an integrated circuit (IC), the program product comprising program code configured for: identifying a function of an interconnect in the layout from data of the layout embodied in a computer readable medium; and modifying the layout to form another layout that accommodates the function of the interconnect.

A sixth aspect of the disclosure provides a computer-readable medium that includes computer program code to enable a computer infrastructure to modify a layout of an integrated circuit (IC), the computer-readable medium comprising computer program code for performing the method steps of the disclosure.

A seventh aspect of the disclosure provides a business method for modifying a layout of an integrated circuit (IC), the business method comprising managing a computer infrastructure that performs each of the steps of the disclosure; and receiving payment based on the managing step.

An eighth aspect of the disclosure provides a method of generating a system for modifying a layout of an integrated circuit (IC), the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
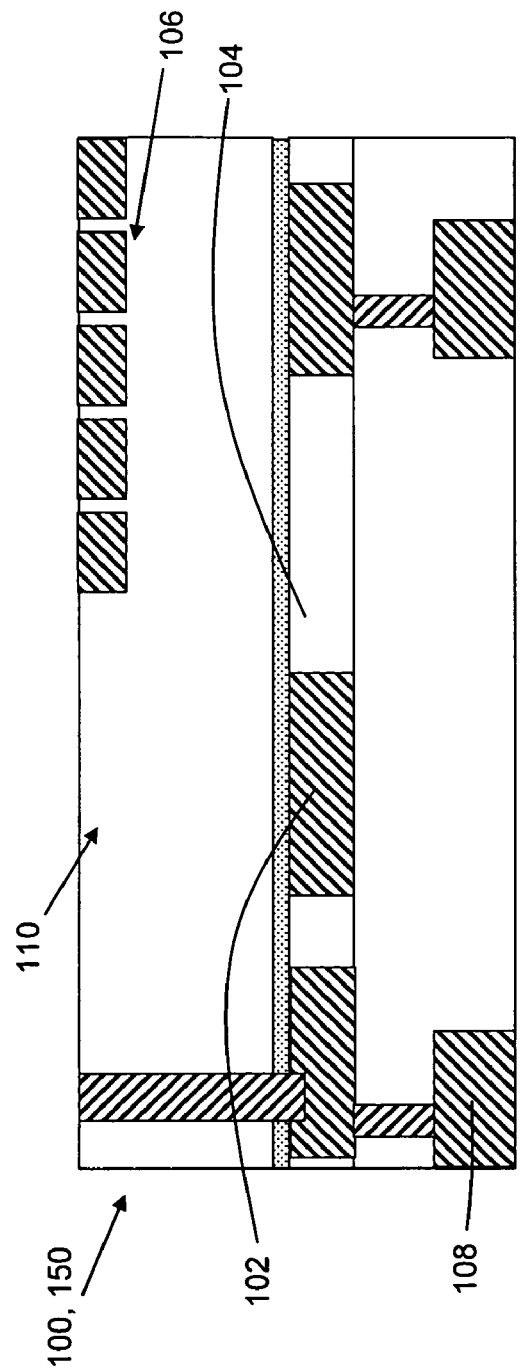
FIG. 1 shows one embodiment of a circuit according to the disclosure.

Referring to FIG. 1, one embodiment of the disclosure relates to a circuit 100 including a high voltage interconnect 102 positioned in a dielectric layer 104. Dielectric layer 104 may include any now known or later developed interlayer dielectric material. High voltage interconnect 102 may include a metal line or a via. High voltage interconnect 102 is positioned such that no fill 106 is above or below the high voltage interconnect at one level above the interconnect or one level below the interconnect. Hence, the possibility of shorts is greatly reduced. In addition, high voltage interconnect 102 may be positioned such that no other interconnect 108 crosses over or under the high voltage interconnect.

Figure 2:
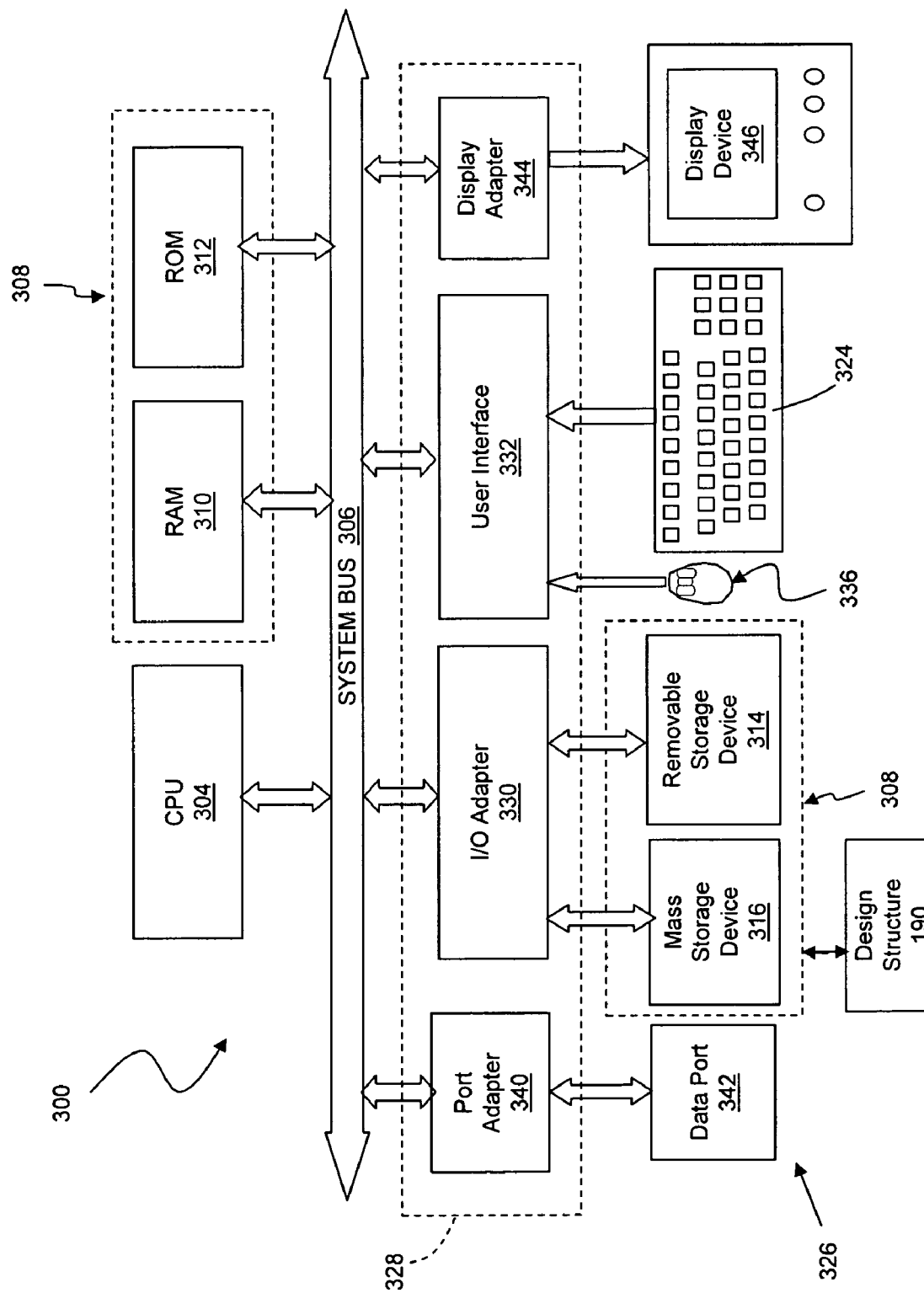
FIG. 2 shows a block diagram of a general purpose computer system which may be used to practice the disclosure.

FIG. 2 illustrates a block diagram of a general-purpose computer system which can be used to implement circuit 100 (FIG. 1) and a design structure 190, described herein. Circuit 100 (FIG. 1) as described above is part of the design for an integrated circuit chip. The chip design is created in a graphical computer programming language, and coded as a set of instructions on machine readable removable or hard media (e.g., residing on a graphical design system (GDS) storage medium). That is, design structure 190 (FIG. 2) is embodied in a machine readable medium 308 used in a design process. (Although design structure 190 is shown interfacing with mass storage device 316 or removable storage device 314, it may interface with any part of machine readable media 308). Design structure 190 includes a high voltage interconnect 102 (FIG. 1) positioned in a dielectric layer 104 (FIG. 1), the high voltage interconnect positioned such that no fill 106 (FIG. 1) is above or below the high voltage interconnect. Design structure 190 may include a netlist, which describes circuit 100 (FIG. 1), and may include test data files, characterization data, verification data, or design specifications. If the designer does not fabricate chips or the photolithographic masks used to fabricate chips, the designer transmits the resulting design structure 190 by physical means (e.g., by providing a copy of the storage medium storing the design) or electronically (e.g., through the Internet) to such entities, directly or indirectly. The stored design is then converted into the appropriate format (e.g., graphic design system II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

FIG. 2 shows a computer system 300, which has at least one microprocessor or central processing unit (CPU) 304. CPU 304 is interconnected via a system bus 306 to machine readable media 308, which includes, for example, a random access memory (RAM) 310, a read-only memory (ROM) 312, a removable and/or program storage device 314 and a mass data and/or program storage device 316. For the purposes of this description, machine readable media (also referred to as a computer-usable or computer readable medium) can be any apparatus that can contain, store, communicate, propagate, or transport the program for use by or in connection with the instruction execution system, apparatus, or device, i.e., computer system. The medium can be an electronic, magnetic, optical, electromagnetic, infrared, or semiconductor system (or apparatus or device) or a propagation medium. I/O device(s) 326 can comprise any device that enables a user to interact with computer system 300 or any device that enables computer system 300 to communicate with one or more other computing devices. Input/output device(s) 326 can be coupled to system bus 306 either directly or through intervening I/O controllers 328. As illustrated, an input/output (I/O) adapter 330 connects mass storage device 316 and removable storage device 314 to system bus 306; user interface 332 connects a keyboard 334 and a mouse 336 to system bus 306; a port adapter 340 connects a data port 342 to system bus 306; and a display adapter 344 connects a display device 346. ROM 312 contains the basic operating system for computer system 300. Examples of removable data and/or program storage device 314 include magnetic media such as floppy drives, tape drives, portable flash drives, zip drives, and optical media such as CD ROM or DVD drives. Examples of mass data and/or program storage device 316 include hard disk drives and non-volatile memory such as flash memory. In addition to keyboard 334 and mouse 336, other user input devices such as trackballs, writing tablets, pressure pads, microphones, light pens and position-sensing screen displays may be connected to user interface 332. Examples of display device 346 include cathode-ray tubes (CRT) and liquid crystal displays (LCD).

Computer system 300 can comprise any general purpose computing article of manufacture capable of executing computer program code installed by a user (e.g., a personal computer, server, handheld device, etc.). However, it is understood that computer system 300 is only representative of various possible equivalent computing devices that may perform the various processes of the disclosure. To this extent, in other embodiments, computer system 300 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer system 300 is only illustrative of various types of computer infrastructures for implementing the disclosure. For example, in one embodiment, computer system 300 comprises two or more computing devices (e.g., a server cluster) that communicate over any type of interconnected and/or interconnectless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

A machine readable computer program may be created by one of skill in the art and stored in computer system 300 and/or any one or more of machine readable media 308 to simplify the practicing of this disclosure. In operation, information for the computer program created to run the present disclosure is loaded on the appropriate removable data and/or program storage device 314, fed through data port 342 or entered using keyboard 334. A user controls the program by manipulating functions performed by the computer program and providing other data inputs via any of the above mentioned data input means. Display device 346 provides a means for the user to accurately control the computer program and perform the desired tasks described herein.

Figure 3:
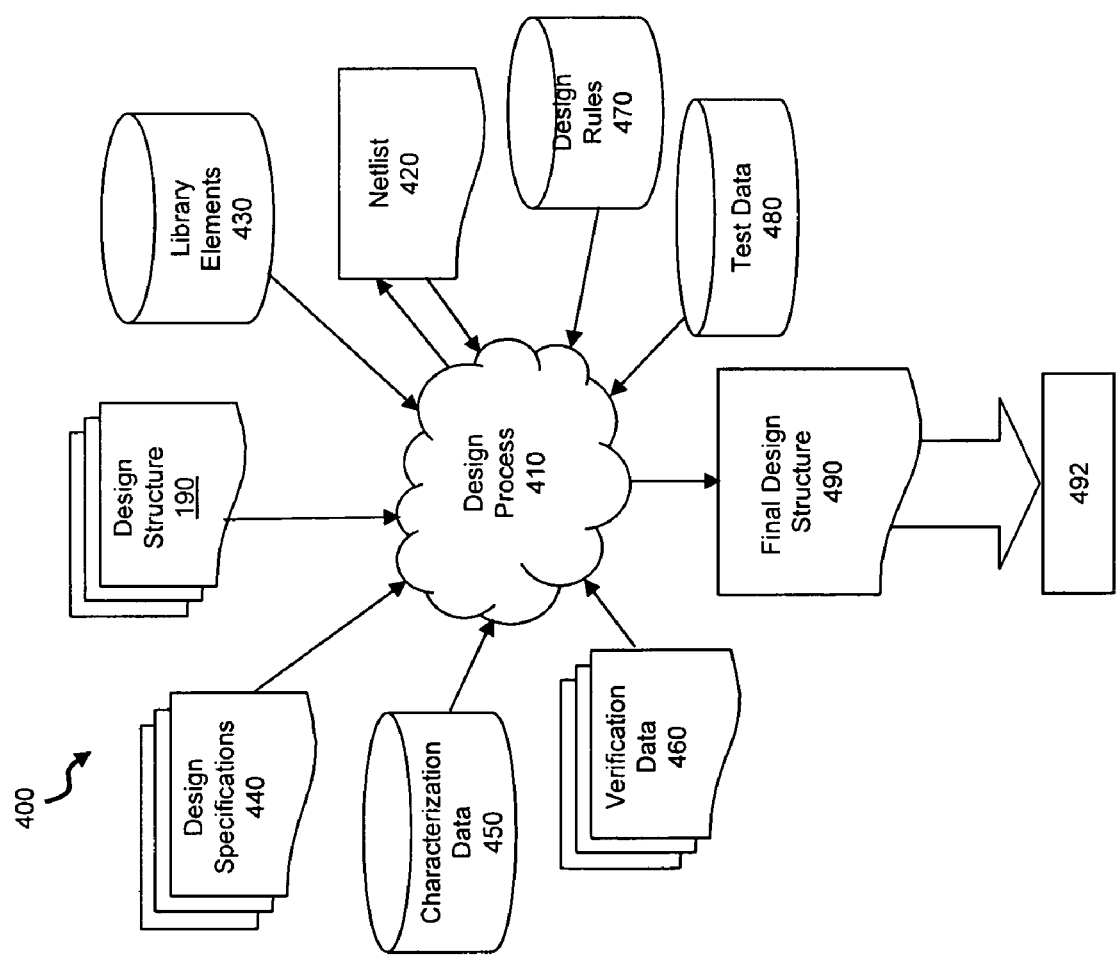
FIG. 3 shows a flow diagram of a design process used in semiconductor design, manufacturing, and/or test.

FIG. 3 shows a block diagram of an example design flow 400. Design flow 400 may vary depending on the type of integrated circuit (IC) being designed. For example, a design flow 400 for building an application specific IC (ASIC) will differ from a design flow 400 for designing a standard component. Design structure 190 is an input to a design process 410 and may come from an IP provider, a core developer, or other design company. Design structure 190 comprises circuit 100 in the form of schematics or a hardware-description language (HDL) (e.g., Verilog, VHDL, C, etc.). Design structure 190 may be on one or more of machine readable medium 308 as shown in FIG. 2. For example, design structure 190 may be a text file or a graphical representation of circuit 100. Design process 410 synthesizes (or translates) circuit 100 into a netlist 420, where netlist 420 is, for example, a list of interconnects, transistors, logic gates, control circuits, I/O, models, etc. and describes the connections to other elements and circuits in an integrated circuit design and recorded on at least one of machine readable medium 308.

Design process 410 includes using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 40 nm, etc.), design specifications 440, characterization data 450, verification data 460, design rules 470, and test data files 480, which may include test patterns and other testing information. Design process 410 further includes, for example, standard circuit design processes such as timing analysis, verification tools, design rule checkers, place and route tools, etc. One of ordinary skill in the art of integrated circuit design can appreciate the extent of possible electronic design automation tools and applications used in design process 410 without deviating from the scope and spirit of the disclosure.

Ultimately, design process 410 translates circuit 100, along with the rest of the integrated circuit design (if applicable), into a final design structure 490 (e.g., information stored in a GDS storage medium). Final design structure 490 may comprise information such as, for example, test data files, design content files, manufacturing data, layout parameters, interconnects, levels of metal, vias, shapes, test data, data for routing through the manufacturing line, and any other data required by a semiconductor manufacturer to produce circuit 100. Final design structure 490 may then proceed to a stage 492 of design flow 400, where stage 492 is, for example, where final design structure 490 proceeds to tape-out, is released to manufacturing, is sent to another design house or is sent back to the customer.

Figure 4:
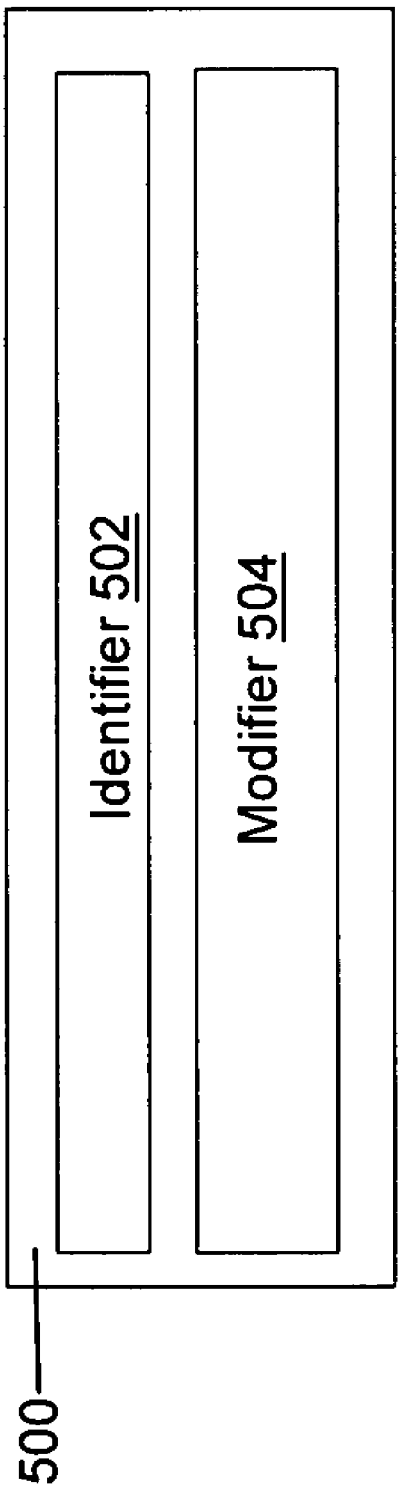
FIG. 4 shows a block diagram of one embodiment of a design system for implementing part of the design process of FIG. 3.

Turning to FIG. 4, a block diagram of one embodiment of a design system 500 for implementing a part of design process 410 (FIG. 3) according to the disclosure is illustrated. Design system 500 is stored on machine readable medium 308 (FIG. 2). Design system 500 includes an identifier 502 and a modifier 504, the functions of which will be described further herein.

Figure 6:
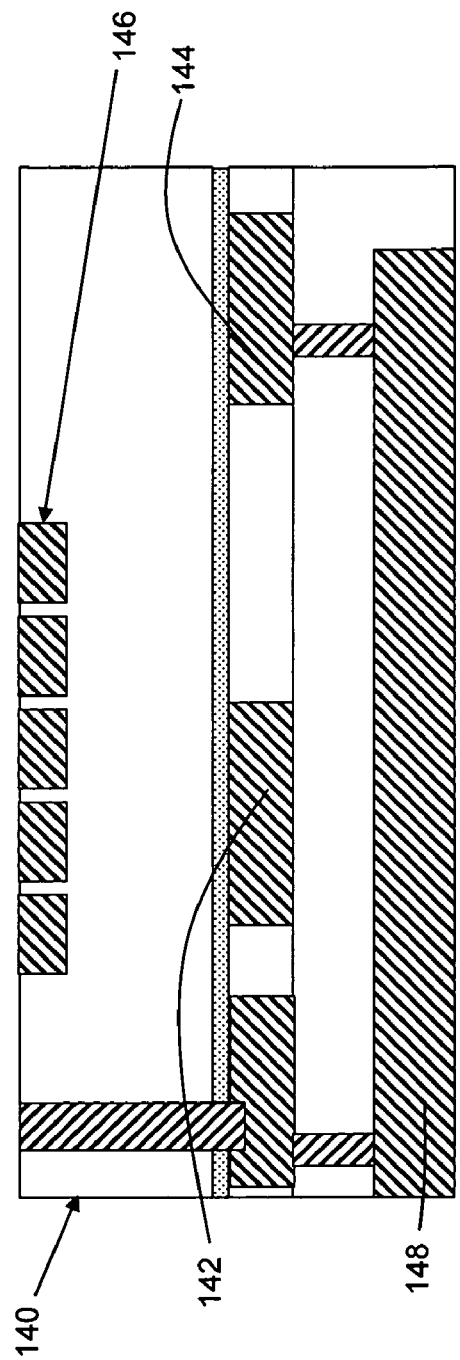
FIG. 6 shows a preliminary version of a layout and design structure prior to modification according to the flow diagram of FIG. 5.
Figure 5:
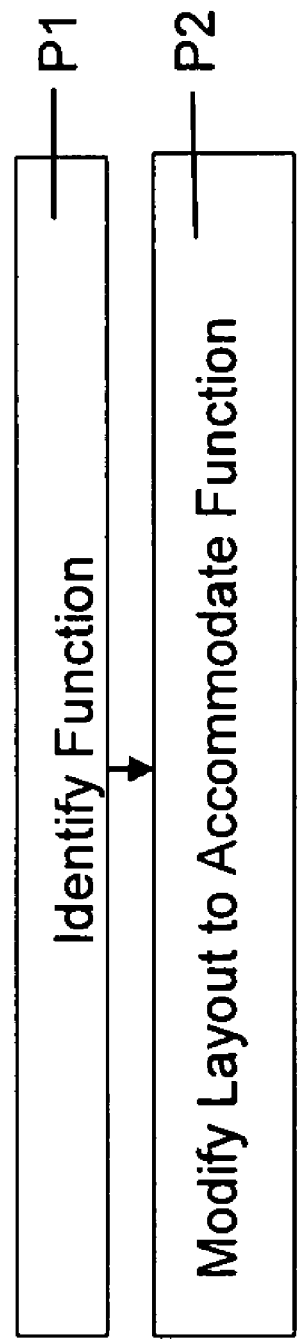
FIG. 5 shows a flow diagram of one embodiment of the part of the design process.

Turning to FIG. 5, a flow diagram illustrating one embodiment of part of design process 410 including modifying a layout of an IC is illustrated. FIG. 5 will be described in conjunction with FIGS. 1 and 6 (latter of which is on same page as FIG. 1). In process P1, identifier 502 identifies a function of an interconnect 142 (FIG. 6) in a layout 140 (FIG. 6) from data of the layout embodied in a computer readable medium 308 (FIG. 2). The data may include at least one of: a description of a connection such as one to a high voltage input-output (I/O) pad as design shapes or to a high voltage field effect transistor (FET) structure, identified by a different gate oxide thickness; schematic descriptions; netlists, which may include technology library elements or non-specific logic or a logical description of the chip (e.g., VHDL or HDL); an electronic description of the design shapes containing a high voltage identifier; a schematic description including a high voltage identifier; a netlist with a high voltage identifier; or a net name containing a high voltage identifier; or any other chip description. In one embodiment, the function of interconnect 142 is that of a high voltage interconnect (e.g., >30 V). However, the scope of the disclosure is not limited to an interconnect having that function. For example, the disclosure may be applied to interconnects having functions such as high speed lines which can create noise in other lines, noise-sensitive paths that need to be separated from other lines, e.g., timing sensitive, analog lines or low voltage lines that could be easily disturbed. The identifying may take a variety of forms depending on the function to be identified. For the high voltage example, the identifying may include, for example, evaluating net names and/or evaluating wiring to or from interconnect 142, e.g., for the high voltage example, whether they couple to high voltage pads or shapes in the front end of line.

In process P2, layout 140 (FIG. 6) is modified to form another layout 150 (FIG. 1) that accommodates the function of interconnect 142. For the above example of a high voltage interconnect, the modifying may include modifying layout 140 (FIG. 6) to avoid breakdown of the high voltage interconnect during operation of the IC. This breakdown can be caused either by an intrinsic property of the dielectric, or a distance determined by manufacturing process tolerance combined with the dielectric properties. For example, as discernible by comparing FIGS. 1 and 6, the modifying may include preventing placement of fill shapes 146 (FIG. 6) under or above any portion of high voltage interconnect 142, adjusting spacing from high voltage interconnect 142 to adjacent interconnects 144, removing a crossing of high voltage interconnect 142 with another interconnect 148. FIG. 1 shows layout 150 including high voltage interconnect 102 positioned such that no fill 106 is above or below the high voltage interconnect, and such that no other interconnect 108 crosses over or under the high voltage interconnect. Modifying fill shapes 106 may consider factors such as maintaining proper metal density for manufacturable-polishing on multiple metal levels, packing density and line resistance, etc. Spacing between high voltage interconnect 108 and other interconnects 108 may also have been modified. In one embodiment, modifying may include determining an acceptable distance from the high voltage interconnect 142 to another interconnect 144 based on a voltage of the high voltage interconnect and an acceptable dielectric breakdown field for a dielectric adjacent to the high voltage interconnect. FIG. 1 shows intrinsic breakdown for various materials. Manufacturing processes, which may lead to sharp corners, metal overhangs and other issues, may reduce the breakdown fields below the intrinsic values. In addition to avoiding fill shapes, modification of the fill shapes could reduce the risk of dielectric failure. For example, fill shapes could change the aspect ratio in order to move one side further away from the identified metal line. The fill shape could be rounded to reduce fields at the corner. Other high voltage issues can be mitigated through the use of fill shapes. For example, rail to rail swings on the high voltage lines will introduce noise in neighboring lines by electromagnetic coupling. Introducing fill shapes can serve to screen some of the noise.

Layout 150 (FIG. 1) is output as part of final design structure 490 (FIG. 5) such that final design structure 490 includes high voltage interconnect 102 positioned in dielectric layer 104, the high voltage interconnect positioned such that no fill 106 is above or below the high voltage interconnect. As noted above, final design structure 490 may comprise a netlist, which describes circuit 100 (layout 150), and may reside on a graphical design system (GDS) storage medium 308 (FIG. 2).

Further, final design structure 490 may include, as shown in FIG. 5, test data files 480, characterization data 450, verification data 460 or design specifications 440.

The methods, system, program product, design structure and design flow as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

As discussed herein, various systems may be described as "obtaining" data. It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable, computer-readable medium or machine readable medium providing program code for use by or in connection with a computer system or any instruction execution system, which when executed, enables a computer system to perform the processes described herein.

In another embodiment, the disclosure provides a method of generating a system for performing the processes described herein. In this case, a computer system 300, can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computer system 300, from a machine readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as an application service provider (ASP), could offer to perform the processes as described herein. In this case, the service provider can manage (e.g., create, maintain, support, etc.) a computer infrastructure, such as computer system 300, that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of modifying a layout of an integrated circuit (IC), the method comprising:
   identifying a function of an interconnect in the layout from data of the layout embodied in a non-transitory computer readable medium; and
   modifying, by a computer, the layout to form another layout that accommodates the function of the interconnect, wherein the interconnect includes a high voltage interconnect, and the modifying includes modifying the layout to avoid breakdown of the high voltage interconnect during operation of the IC, wherein the modifying includes preventing placement of fill shapes under or above any portion of the high voltage interconnect.

2. The method of claim 1, wherein the data includes at least one of: a description of a connection; a schematic description; a netlist; an electronic description of the design shapes containing a high voltage identifier; a schematic description including a high voltage identifier; a netlist with a high voltage identifier or a net name containing a high voltage identifier.

3. The method of claim 1, wherein the modifying includes adjusting spacing from the high voltage interconnect to adjacent interconnects.

4. The method of claim 1, wherein the modifying includes removing a crossing of the high voltage interconnect with another interconnect.

5. The method of claim 1, wherein the modifying includes determining an acceptable distance from the high voltage interconnect to another interconnect based on a voltage of the high voltage interconnect and an acceptable dielectric breakdown field for a dielectric adjacent to the high voltage interconnect.

6. A system for modifying a layout of an integrated circuit (IC), the system comprising:
   means for identifying a function of a high voltage interconnect in the layout from data of the layout embodied in a non-transitory computer readable medium; and
   means for modifying the layout to form another layout that accommodates the function of the interconnect, wherein the modifying means prevents placement of fill shapes under or above any portion of the high voltage interconnect.

7. The system of claim 6, wherein the data includes at least one of: a description of a connection; a schematic description; a netlist; an electronic description of the design shapes containing a high voltage identifier; a schematic description including a high voltage identifier; a netlist with a high voltage identifier or a net name containing a high voltage identifier.

8. The system of claim 6, wherein the modifying includes modifying the layout to avoid breakdown of the high voltage interconnect during operation of the IC.

9. The system of claim 6, wherein the modifying means adjusts spacing from the high voltage interconnect to adjacent interconnects.

10. The system of claim 6, wherein the modifying means removes a crossing of the high voltage interconnect with another interconnect.

11. The system of claim 6, wherein the modifying means includes means for determining an acceptable distance from the high voltage interconnect to another structure based on a voltage of the high voltage interconnect and an acceptable dielectric breakdown field for a dielectric adjacent to the high voltage interconnect.

12. A circuit comprising:
a high voltage interconnect positioned in a dielectric layer such that no fill is above or below the high voltage interconnect.

13. The circuit of claim 12, wherein no other interconnect crosses over or under the high voltage interconnect at one level above the interconnect or at one level below the interconnect.

14. A design structure embodied in a non-transitory machine readable medium used in a design process, the design structure comprising:
a circuit including a high voltage interconnect positioned in a dielectric layer such that no fill is above or below the high voltage interconnect at one level above the interconnect and one level below the interconnect.

15. The design structure of claim 14, wherein the design structure comprises a netlist, which describes the circuit.

16. The design structure of claim 14, wherein the design structure resides on a graphical design system (GDS) storage medium.

17. The design structure of claim 14, wherein the design structure includes test data files, characterization data, verification data, or design specifications.

* * * * *